(12) United States Patent
Werker et al.

(10) Patent No.: US 10,644,588 B2
(45) Date of Patent: May 5, 2020

(54) EMC-FILTER FOR SUPPRESSING NOISE SIGNALS

(71) Applicant: Hanon Systems, Daejeon (KR)

(72) Inventors: Stephan Werker, Merzenich-Golzheim (DE); Holger Gerberich, Erftstadt (DE); Thomas Büth, Köln (DE); Nikolaus Boschmann, Meckenheim (DE)

(73) Assignee: HANON SYSTEMS, Daejeon (KR)

( * ) Notice: Subject to any disclaimer, the term of this patent is extended or adjusted under 35 U.S.C. 154(b) by 84 days.

(21) Appl. No.: 16/040,754

(22) Filed: Jul. 20, 2018

(65) Prior Publication Data

US 2019/0081554 A1    Mar. 14, 2019

(30) Foreign Application Priority Data

Sep. 11, 2017    (DE) .......................... 10 2017 120 924

(51) Int. Cl.
*H01F 27/28*    (2006.01)
*H02M 7/00*    (2006.01)
(Continued)

(52) U.S. Cl.
CPC ............ *H02M 1/44* (2013.01); *H01F 17/062* (2013.01); *H01F 27/24* (2013.01); *H01F 27/28* (2013.01); *H01F 27/40* (2013.01); *H02M 7/003* (2013.01); *H03H 1/00* (2013.01); *H03H 7/0115* (2013.01); *H03H 7/427* (2013.01); *H05K 1/0233* (2013.01); *H05K 1/09* (2013.01); *H05K 1/111* (2013.01);
(Continued)

(58) Field of Classification Search
CPC .......... H01F 27/28; H01F 17/06; H01F 17/62; H02M 7/00
USPC ..... 361/767, 728; 331/78, 105; 333/12, 181, 333/183–185; 336/200, 229
See application file for complete search history.

(56) References Cited

U.S. PATENT DOCUMENTS 5,726,611 A  *  3/1998  Takagi ............... H01F 17/06
                                                        333/181
2003/0112084 A1* 6/2003 Chen ..................... H03B 1/04
                                                        331/78
(Continued)

FOREIGN PATENT DOCUMENTS

DE           10048290 A1   5/2002
DE       102014101403 A1   11/2014
(Continued)

*Primary Examiner* — Xiaoliang Chen
(74) *Attorney, Agent, or Firm* — Norton Rose Fulbright US LLP; James Crawford

(57) ABSTRACT

The invention which relates to an EMC filter for the suppression of interference signals addresses the problem of specifying a solution with which reworking expenditures of an inverter board are reduced and, additionally, installation space restriction as well as reduction of development and production costs are attained. This problem is resolved thereby that in an EMC filter module at least one core of a choke with a winding is disposed on a first mounting board, that at least one of the capacitors is disposed on the first mounting board, that the first mounting board comprises at least two contact means and that the first mounting board of the EMC filter module is disposed with its contact means on a main board of an inverter and is electrically connected thereto.

19 Claims, 3 Drawing Sheets

Figure 1:
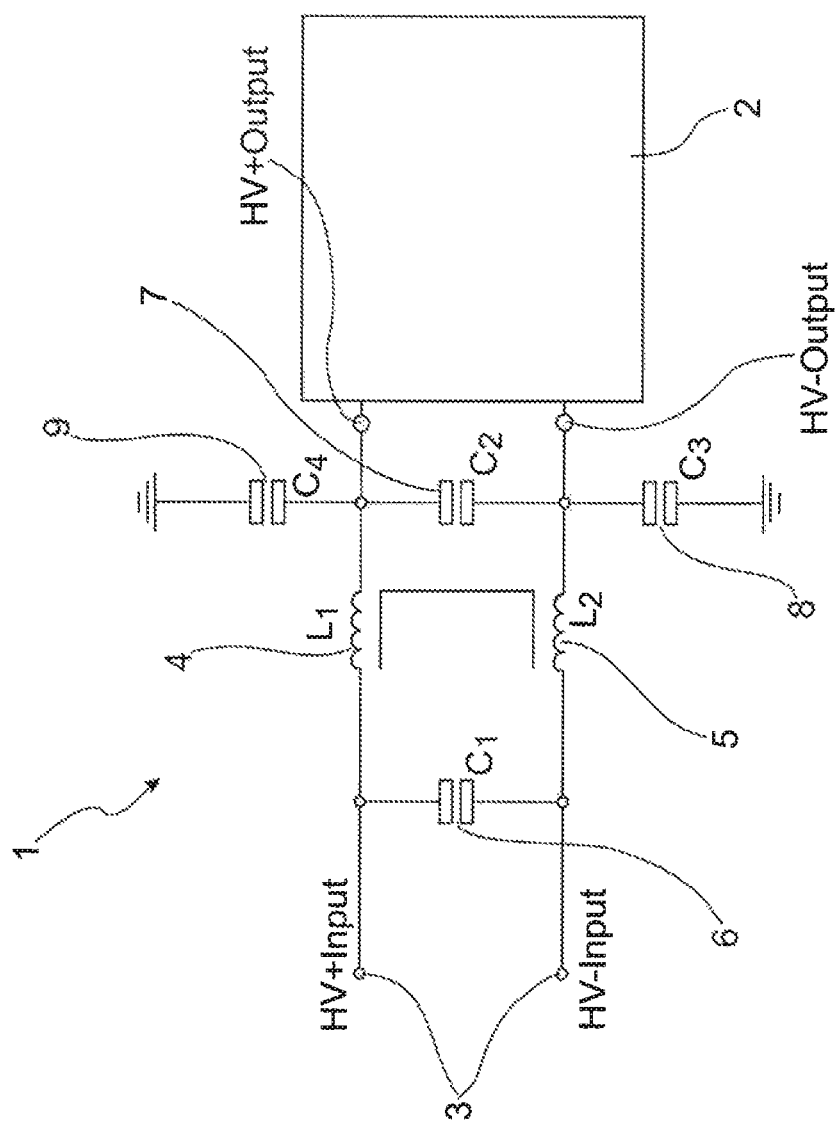

(51) Int. Cl.
*H01F 17/06* (2006.01)
*H02M 1/44* (2007.01)
*H01F 27/24* (2006.01)
*H01F 27/40* (2006.01)
*H03H 1/00* (2006.01)
*H03H 7/01* (2006.01)
*H03H 7/42* (2006.01)
*H05K 1/02* (2006.01)
*H05K 1/09* (2006.01)
*H05K 1/11* (2006.01)
*H05K 1/14* (2006.01)
*H01F 27/06* (2006.01)

(52) U.S. Cl.
CPC ............ *H05K 1/141* (2013.01); *H05K 1/144* (2013.01); *H01F 2017/065* (2013.01); *H01F 2027/065* (2013.01); *H03H 2001/0035* (2013.01); *H05K 2201/042* (2013.01); *H05K 2201/1003* (2013.01); *H05K 2201/1006* (2013.01); *H05K 2201/10015* (2013.01); *H05K 2201/10386* (2013.01); *H05K 2201/10409* (2013.01)

(56) References Cited

U.S. PATENT DOCUMENTS

| | | | | |
|---|---|---|---|---|
| 2006/0186982 | A1* | 8/2006 | Dudley | H01F 17/062 336/229 |
| 2007/0075818 | A1* | 4/2007 | Hansen | H01F 38/14 336/200 |
| 2014/0266507 | A1* | 9/2014 | Fauer | H02M 1/10 333/181 |
| 2016/0336846 | A1 | 11/2016 | Walczak et al. | |
| 2016/0352016 | A1* | 12/2016 | Ito | H01Q 7/00 |
| 2017/0244335 | A1* | 8/2017 | Lim | H02M 7/003 |

FOREIGN PATENT DOCUMENTS

| | | |
|---|---|---|
| EP | 3229564 A1 | 10/2017 |
| JP | H06104590 A | 4/1994 |
| JP | 2006060928 A | 3/2006 |
| JP | 2010284027 A | 12/2010 |
| JP | 2016100996 A | 5/2016 |
| KR | 101429499 B1 | 8/2014 |
| WO | 2016181835 A1 | 11/2016 |

* cited by examiner

EMC-FILTER FOR SUPPRESSING NOISE SIGNALS

CROSS REFERENCE TO RELATED APPLICATIONS

This application claims priority from German Patent Application No. 102017120924.7 filed Sep. 11, 2017, which is hereby incorporated by reference in its entirety.

The invention relates to an EMC filter for the suppression of interference signals, comprising at least one choke, at least one core and several capacitors.

In electronic componentry, in which switching processes are carried out with electric voltages or currents, interferences are generated as a consequence of these switching processes due to the generated electrical pulses with the associated emission of interference signals. These interferences can propagate as electromagnetic waves conductively across lines as well as also radiatively through free space.

The capability of a technical device not to subject other devices to unintentional or accidental electric or electromagnetic effects or be subjected to same by other devices, is referred to as electromagnetic compatibility (EMC).

To avoid or minimize the propagation of such interferences, prior art proposes equipping these componentries with a filter unit, a so-called EMC filter or network filter. It is also known to take measures for shielding or screening the electronic componentry in order to avoid impacting the correct functions of other electronic components or devices through interference signals of too high an amplitude level.

The magnitudes of such interference signals that must be observed by a device currently in circulation are established in EMC standardizations associated with this device and are described by means of limit values and minimum requirements that must be satisfied.

Known in this context are for example so-called ECE provisions which include a catalog of international agreements on uniform technical regulations for motor vehicles as well as for parts and equipment objects of motor vehicles. The area of radio interference suppression is treated, for example, in ECE R10, which has to be followed for future developments and which will result in further decrease of the permissible interference radiation.

Electromagnetic interference radiation is also generated in the operation of electric inverters that actuate an electric motor and thus switch currents of high amplitude. Such an inverter is utilized, for example, in actuating a motor in an air conditioner compressor of a motor vehicle.

Due to the escalating EMC requirements for motor vehicles, such as, for example, also hybrid and electric motor vehicles, there is the necessity of equipping electric consumers in these motor vehicles with an EMC filter in order to ensure the maintenance of the specified electromagnetic limit values also in componentries such as electric air-conditioning compressors.

A known solution for suppressing the interference radiation on electric or electronic componentries is the use of a passive EMC filter. Such passive EMC filters are conventionally realized with the aid of passive components such as capacitors, coils and resistors that are wired with one another in known, suitable manner and in this manner generate the desired filter effect.

Based on the type of interferences to be filtered by means of an EMC filter, the distinction is made between common mode interferences and differential mode interferences. The interference spectrum to be filtered by the EMC filter is in practice comprised of the sum of both superposed interference components.

The type, structure and especially the voltage level of an inverter, for example for an electric refrigerant compressor, determine which of the two interference components is predominant and, consequently, which of the two interference components must be filtered more strongly.

The interference components occurring in high-voltage inverters that operate with voltages between 300 V and 800 V are primarily common mode interferences.

Confining the application field of the present invention to the avoidance or minimization of only common mode interferences or of only differential mode interferences is not intended. Thus, an exemplary embodiment, described in the following, with respect to only one type of these interferences should not be considered a limitation since the person of skill in the art is at any time capable of adapting the implementation to the interferences of the other type through appropriate expert modification. This can take place through the replacement of a common mode choke with differential mode chokes.

Prior art proposes filtering, for example, such differential mode interferences by employing so-called chokes in combination with capacitors in a passive EMC filter. For this purpose, for example, in each inverter feed line HV+ and HV− one choke $L_1$ and $L_2$ is inserted and corresponding capacitors $C_1$ and $C_2$ are disposed in feed lines HV+ and HV− before and after the chokes $L_1$ and $L_2$. In addition, a third capacitor $C_3$, facing the inverter, is disposed after choke $L_2$ between line HV− and ground potential and a fourth, capacitor $C_4$, facing the inverter, is disposed after choke $L_1$ between line HV+ and ground potential in the passive EMC filter. In practical realization each capacitor $C_1$ to $C_4$ can be composed of several subcapacitors or several capacitor components.

Chokes as coils or inductors are known for limiting currents in electric lines, for the intermediate storage of energy in the form of their magnetic field, for impedance conversion or for filtering. Such chokes are frequently inserted into a line of an electric component. To enhance their so-called inductive reactance or reactance, chokes frequently include a soft magnetic core. It is known to utilize ferromagnetic substances as the soft magnetic materials that can be readily magnetized in a magnetic field.

Through the chokes $L_1$ and $L_2$, disposed in the feed lines HV+ and HV− of the inverter, flows the maximally possible input current of the inverter and these chokes must consequently be appropriately dimensioned for this current load.

This interference-superimposed input current engenders in chokes $L_1$ and $L_2$ a magnetic field. When utilizing so-called common mode chokes, due to the counterdirected windings of the two choke windings disposed on a common core, the magnetic fields of the input currents in the common core cancel each other out.

US 2016/0336846 A1 discloses an inductive component mounted on a printed circuit board and comprising a substantially flat tray and a choke, the choke being mounted on an upper side of the tray and including a core and at least two coils wound about the core. The wires of the at least two coils comprise end segments that extend through the tray and terminate on a lower side of the tray opposite to the upper side. The tray includes notches for guiding the end segments through the tray and latches for fixing the end segments of the wires within the notches. By means of this solution a compact unit of a tray and a choke is provided which can be disposed in the manner known within prior art on an inverter circuit board.

JP 2010-284027 A discloses a configuration for power supply comprising several component voltages. The configuration comprises several annular transformer cores that are disposed on a common circuit board adjacent to one another. The transformer cores include a common primary-side winding that is connected to an actuating circuit. Each transformer comprises its own secondary-side winding that is connected to an output-side driver circuit to provide an output voltage. This solution of prior art is also suitable for disposition on an inverter circuit board.

One disadvantage of such passive EMC filter lies therein that, to filter large interference amplitudes or to maintain correspondingly low limit values, these filters require large installation space, for example on a main board. Such a main board, also referred to as inverter circuit board, is required in order to take up the components necessary for controlling the operating mode of the inverter.

In addition, various customers request inverter circuit boards that must meet various different EMC specifications on one hand and, on the other hand, must meet different installation space requirements. It is thus very frequently necessary to adapt the layout of the inverter circuit boards to the given specifications, which is time consuming and cost intensive.

Because of these described disadvantages there is a need of a suitable solution that restricts the range of necessary variations of inverter circuit boards.

The objective of the invention comprises specifying an EMC filter that aids in reducing the expenses of reworking the inverter circuit boards, enables installation space restrictions and contributes to reducing the development and production expenditures.

This problem is resolved through a subject matter with the characteristics of Patent Claim 1 of the independent patent claims. Further developments are specified in the dependent Patent Claims 2 to 10.

In a conventional circuit configuration of a passive EMC filter chokes are disposed in the feed lines HV+ and HV− of an inverter. In addition, capacitors or capacitances are provided between the feed lines HV+ and HV− before and after the chokes as well as between ground potential and feed line HV+ and the feed line HV−.

Depending on whether primarily common mode interferences or differential mode interferences are to be suppressed with the passive EMC filter, the windings of the chokes are either disposed on a common core (common mode choke) or they are disposed separately from one another on difference cores (differential mode choke).

The invention provides accommodating a common mode choke or a differential mode choke on one mounting board or between two separate mounting boards. In this case separate means that the mounting board is not a constituent part of the main board or inverter circuit board, that it can, however, be connected with it. In the case of an implementation with two mounting boards, the invention provides disposing the common mode choke or the differential mode choke between the two mounting boards that are oriented parallel to one another.

As such mounting boards are utilized, for example, single-layer or multi-layer circuit boards.

It is furthermore provided to dispose additional components on the first or the second mounting board. Such components are typically the capacitances necessary for an EMC filter circuit.

It is furthermore provided to equip the first and/or the second mounting board with contact means across which at least one of the mounting boards can be electrically connected to the main board or inverter circuit board of an inverter. This is necessary in order to electrically connect the corresponding input-side and output-side terminals of the EMC filter with the inverter circuit on the inverter circuit board.

The contact means can, moreover, be utilized for the mechanical securement of the mounting board to the main board. An additionally necessary mechanical securement of the mounting board can thereby be omitted.

As the contact means noses or lugs can be provided on the first and/or the second mounting board, which are introduced into notches in the main board suitable for receiving these noses or lugs. An electrically conductive as well as also mechanically stable connection can be attained in this case through a solder connection, for example, at those sites at which the noses or lugs are inserted in the notches. For this purpose, the noses or lugs of the mounting boards comprise, for example, at least on one side a copper coating. In addition, adjacent to or about the notches in the main board appropriate conductor tracks are provided.

Such solder connection between the contact means, developed as noses or lugs, and the conductor tracks on the main board, can be generated for example by means of wave soldering or flow soldering.

Alternatively, an electrically conductive connection between the contact means or the mounting boards and the main board can also be established across solder lugs, contact plugs, clip contacts or threaded contacts.

To obtain a compact, space-saving architecture of the main board, the invention provides connecting the first or the first and the second mounting board at an orientation at right angles to the main board.

Consequently, the invention provides for the EMC filter to be implemented as a separate EMC filter module that is electrically and mechanically connected with the main board. This EMC filter module comprises for example a common mode choke disposed between the first and the second mounting board as well as the capacitances additionally necessary for the wiring of the EMC filter module. In an alternative implementation of the EMC filter module between the first and the second mounting board two differential mode chokes are provided as well as the capacitances additionally necessary for the wiring of this EMC filter module.

This module architecture of the EMC filter in the form of an EMC filter module enables combining an already completely developed EMC filter module with a main board that is to be developed anew. In this way it is feasible to make use of an available range of already developed EMC filter modules to meet different requirements of various customers in the new development of main boards. It is herein provided that the EMC filter modules offer different parameters for the attenuation of an EMC interference.

Adaptation of an EMC filter module is also feasible without changes to the main board in order to satisfy changing customer demands.

The invention also provides disposing a connection means between the first and the second mounting board. This connection means has the task, for one, of mechanically connecting the first mounting board securely with the second mounting board and to fix the mounting boards in a position parallel to one another. The task of the connection means comprises, for another, to fix, for example, the core of the common mode choke mechanically between the mounting boards. A third task of the connection means when using a common mode choke comprises isolating the two windings applied on a common core. The intention of this isolation is to electrically insulate the two windings against one another. Thereby an electrical short circuit between the two windings is avoided and sparks are also prevented from jumping between the two windings.

Provided as a connection means is the use of a web or a plate of non-conductive material, such as a synthetic material or a circuit board material without copper coating.

With the disposition of a common mode choke between the mounting boards one connection means and, with the disposition of two differential mode chokes, two connection means are provided since each core must be fixed by means of a connection means.

Figure 2:
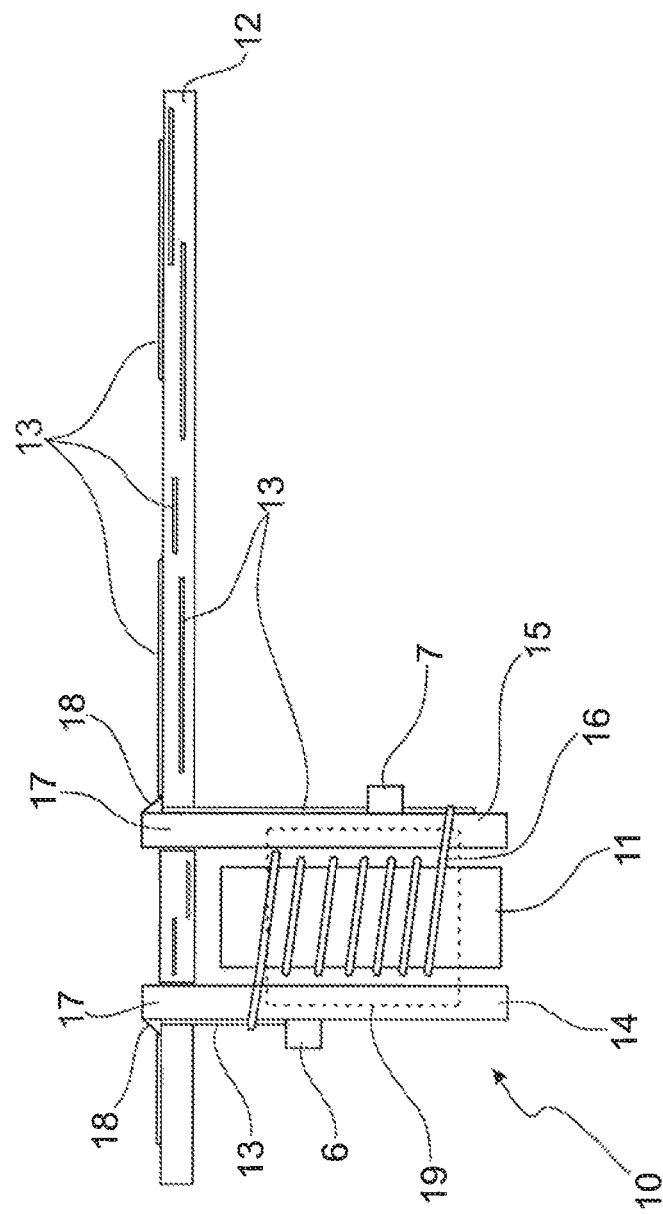
Figure 3:
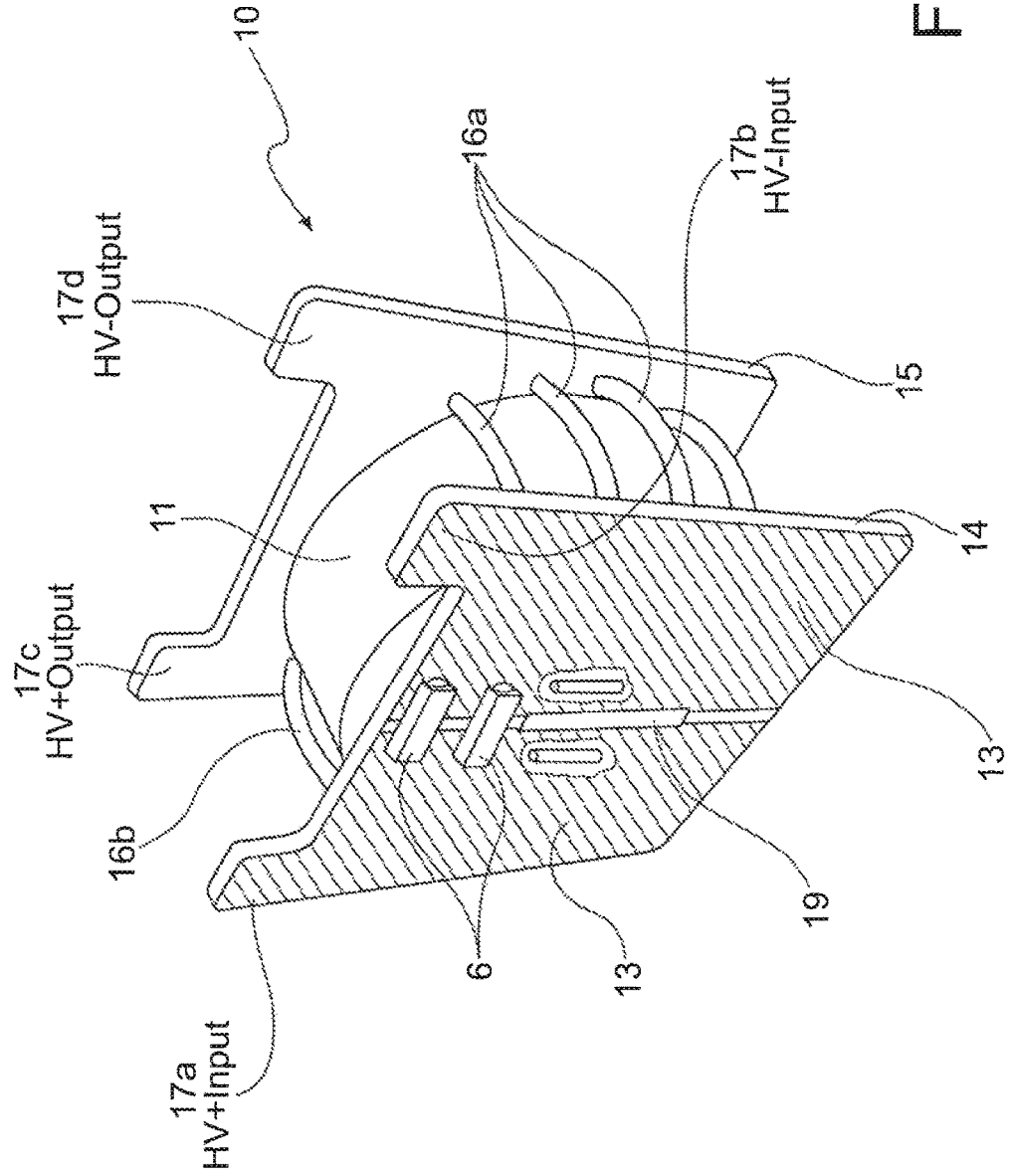

Further details, characteristics and advantages of implementations of the invention are evident based on the subsequent description of embodiment examples with reference to the associated drawing. Therein depict:

FIG. 1: an exemplary circuit configuration of a passive EMC filter according to prior art using as an example an EMC filter circuit with common mode choke, FIG. 2: a schematic diagram of a structural unit for actuating an inverter, comprised of a main board and an EMC filter module according to the invention, and FIG. 3: a perspective representation of an exemplary embodiment of an EMC filter module according to the invention with two mounting boards and a common mode choke.

FIG. 1 shows an exemplary circuit configuration of a passive EMC filter 1 according to prior art that is connected to an inverter 2. The EMC filter circuit 1 implemented as a passive filter comprises an input 3, at which, for example, a voltage of 400 V can be applied and comprises chokes $L_1$ 4 and $L_2$ 5 in feed lines HV+ and HV− which, in the case of a common mode choke, are realized through the windings $L_1$ 4 and $L_2$ 5 disposed on a common core.

While the first capacitance 6 denoted $C_1$ is disposed between the lines HV+ and HV− directly at the input of the passive EMC filter circuit 1 and before chokes $L_1$ 4 and $L_2$ 5, the second capacitance 7 denoted $C_2$ is disposed after chokes $L_1$ 4 and $L_2$ 5 at the output of the EMC filter circuit 1 and consequently at the input of the inverter 2.

A third capacitance 8 denoted $C_3$ is disposed between the line HV− and ground potential. A fourth capacitance 9 denoted $C_4$ is disposed between the line HV+ and ground potential.

As is conventional in prior art, it is provided that the inverter 2 generates the electrical control signals that are necessary for operating an electric motor, not shown, which, for example, drives a refrigerant compressor.

This known circuit configuration is also comprised in the EMC filter module 10 according to FIG. 2 and implemented according to the invention in module architecture. Alternatively, instead of a common core 11 or choke core of a common mode choke, two cores 11 of two differential mode chokes can be disposed.

FIG. 2 shows a schematic depiction of a structural unit for actuating an electric drive motor, not shown, by the inverter 2, which unit is comprised of a main board 12 for the inverter 2 and an EMC filter module 10 according to the invention. On the main board 12 the components of the inverter 2 are applied that are necessary, for example, for the control of the operating mode of a motor in an air-conditioning compressor. These components are not explicitly shown in FIG. 2.

The main board 12 can be implemented in the customary manner as a single- or multi-layer circuit board. In the example the main board 12 comprises several copper layers 13 with which the necessary electrical connections for the components of the inverter 2 are provided in the form of conductor tracks.

In contrast to the conventional prior art, the components required for the EMC filter 1 are not disposed on the main board 12 but rather on an EMC filter module 10 according to the invention.

The EMC filter module 10 comprises at least one first mounting board 14 which can be implemented, for example, as a single- or a multi-layer circuit board. On this first mounting board 14 a core 11, for example for a common mode choke, is disposed. On this core 11 the windings 16a of the first choke $L_1$ 4 and the windings 16b of the second choke $L_2$ 5 are disposed. In FIG. 2 this arrangement, comprised of a core 11 and a winding 16, is only depicted by example with a single winding 16 instead of both windings 16a and 16b. This representation does not limit the invention to this implementation.

The invention provides in addition that on the first mounting board 14 the capacitors $C_1$ 6 to $C_4$ 9 necessary for the EMC filter circuit 1 are disposed. Alternatively, also only a portion of these capacitors $C_1$ 6 to $C_4$ 9 can be required and/or be disposed on the first mounting board 14.

It is provided for the first mounting board 14 to comprise contact means 17 with which an electrical connection can be established to the conductor tracks 13 of the main board 12. In an implementation these contact means 17 can be implemented in the form of a nose or lug that project from the mounting board 14.

To receive or to apply electrical contact of the EMC filter module 10 in or to the main board 12, the latter is provided with corresponding notches into which the nose- or lug-shaped contact means 17 can be inserted. To establish an electrical connection between a conductor track 13 of the first mounting board 14 and a conductor track 13 of the main board 12, a solder connection 18 can be provided. In this way an electrically conductive as well as also mechanically stable connection is provided between the first mounting board 14 of the EMC filter module 10 and the main board 12.

The contact means 17 can alternatively be carried out by a person of skill in the art such that an electrically conductive connection between the first mounting board 14 and the main board 12 is established across solder lugs, contact plugs, clip contacts or threaded contacts. A mechanically stable connection can also be obtained in these cases. In all cases, alternatively, additional means for a sound and stable securement of the EMC filter module 10 on the main board 12 can be provided.

In an embodiment of the EMC filter module 10 it can be provided that two cores 11 are disposed on the first mounting board 14. This can be the case, for example, in an implementation of the EMC filter module 10 with two differential mode chokes $L_1$ 4 and $L_2$ 5.

In a further embodiment is provided to dispose, for example parallel to the first mounting board 14, a second mounting board 15. In this case the core 11 of a common mode choke, for example, is disposed between the mounting boards 14 and 15.

The second mounting board 15 also comprises contact means 17 with which it can be electrically wired and mechanically connected to the main board 12, as is already known from the above description regarding the first mounting board 14. On the second mounting board 15, furthermore, capacitors $C_1$ 6 to $C_4$ 9 of the EMC filter module 10 can also be disposed.

For the mechanical connection of the first and the second mounting board 14 and 15 with one another a connection means 19 is provided. This connection means 19, which is depicted in FIG. 2 by a dashed line, is, for example, implemented as a web or a plate of a non-conducting material such as a synthetic material. The connection means 19 can be secured with the first and the second mounting board 14 and 15, for example, by adhesion, threaded connection, pressing, clamping or welding (plastic welding) and in this manner mechanically stabilize the EMC filter module 10.

Apart from this task of mechanical stabilization and fixing of the first and the second mounting boards 14 and 15, the connection means 19 is provided for receiving and mechanically fixing the core 11 between the mounting boards 14 and 15. For this purpose the connection means 19 is implemented such that it, for example, can be inserted into the inner diameter of an annular core 11 under form closure and subsequently be fixedly connected with the first and the second mounting board 14 and 15.

A third task of the connection means 19 when using a common mode choke comprises isolating the two windings 16a and 16b applied on the common core 11. With this isolation an electrical short circuit between the two windings 16a and 16b is avoided and sparks are also prevented from jumping between the two windings 16a and 16b.

In the case in which the EMC filter module 10 is equipped with two cores 11 for two differential mode chokes, for each core 11 one connection means 19 is utilized in the above described manner. Such an embodiment is not depicted in the Figures.

FIG. 3 shows a perspective representation of an exemplary embodiment of the EMC filter module 10 according to the invention. The EMC filter module 10 is implemented with a first and a second mounting board 14 and 15, between which the core 11 of a common mode choke with a first winding 16a and a second winding 16b is disposed.

Between the two mounting boards 14 and 15 a connection means 19 is disposed which is adhered to mounting boards 14 and 15 and fixes the annular core 11. FIG. 3 also shows that on the surface of the first mounting board 14 a copper layer 13 is applied. Through suitable structuring of this copper layer 13 the electrical connections or conductor tracks, necessary for the electrical contacting of the components of the EMC filter module 10, can be generated. In this way, for example, the capacitors 6, 7, 8 or 9 can be disposed on such a surface of the first mounting board 14. In FIG. 3 is depicted by example the first capacitor 6 ($C_1$) on the first mounting board 14, which in the circuit of FIG. 1 is disposed at the input side between the input terminals HV+ and HV−. Further capacitors 7, 8 or 9 can be disposed on the copper layers 13 of the second mounting board 15.

The first mounting board 14 comprises two nose- or lug-shaped contact means 17a and 17b with which an electrical connection can be established with the main board 12, not shown. The main board 12 is provided with corresponding rectangular openings into which the contact means 17a and 17b can be inserted. An electrical connection is established by soldering the copper layer 13 of the first mounting board 14 to a corresponding copper layer 13 or a conductor track 13 of the main board 12.

The same applies to the contact means 17c and 17d that are disposed on the second mounting board 15. The contact means 17a and 17b correspond in FIG. 1 to the input-side terminal designations HV+ Input and HV− Input of the EMC filter module 10. The contact means 17c and 17d correspond in FIG. 1 to the output-side terminal designations HV+ Output and HV− Output of the EMC filter module 10.

LIST OF REFERENCE NUMBERS

1 EMC filter (EMC filter circuit)
2 Inverter
3 Input (HV+/HV−)
4 First choke $L_1$, winding $L_1$
5 Second choke $L_2$, winding $L_2$
6 First capacitor $C_1$, first capacitance
7 Second capacitor $C_2$, second capacitance
8 Third capacitor $C_3$, third capacitance
9 Fourth capacitor $C_4$, fourth capacitance
10 EMC filter module
11 Core, choke core
12 Main board of inverter
13 Copper layers, conductor track, conductive path
14 First mounting board
15 Second mounting board
16, 16a, 16b Winding
17, 17a, 17b, 17c, 17 d Contact means
18 Solder connection
19 Connection means

The invention claimed is:

1. An EMC filter for suppressing interference signals, comprising at least one choke, at least one core and several capacitors, wherein in an EMC filter module at least one core of a choke with a winding is disposed on a first mounting board, that at least one of the capacitors is disposed on the first mounting board, that the first mounting board comprises at least two contact means and that the first mounting board of the EMC filter module is disposed with its contact means on a main board of an inverter and is electrically connected thereto.

2. An EMC filter according to claim 1, further comprising a second mounting board disposed in the EMC filter module and that the core is disposed between the first mounting board and the second mounting board.

3. An EMC filter according to claim 2, wherein the second mounting board is disposed parallel to the first mounting board.

4. An EMC filter according to claim 2, wherein between the first mounting board and the second mounting board a connection means is disposed and wherein the core of the choke is disposed between the first and the second mounting board and is disposed on the connection means.

5. An EMC filter according to claim 2, wherein on a surface of the first mounting board and/or on a surface of the second mounting board at least partially a copper layer is disposed forming conductor tracks.

6. An EMC filter according to claim 2, wherein on the copper layer of the first mounting board and/or of the second mounting board forming conductor tracks capacitors are disposed.

7. An EMC filter according to claim 1, wherein as contact means noses or lugs are disposed on the first and/or the second mounting board or solder lugs or contact plugs or clip contacts or threaded contacts.

8. An EMC filter according to claim 2, wherein between the first and the second mounting board a core of a common mode choke is disposed or two cores of two differential mode chokes.

9. An EMC filter according to claim 5, wherein at least between a copper layer forming conductor tracks of the first mounting board and a copper layer forming conductor tracks of the main board a solder connection is disposed establishing an electrical connection.

10. An EMC filter as in claim 1, wherein the first mounting board is disposed with its orientation perpendicular to the main board.

11. An EMC filter as in claim 3, wherein between the first mounting board and the second mounting board a connection means is disposed and wherein the core of the choke is disposed between the first and the second mounting board and is disposed on the connection means.

12. An EMC filter according to claim 3, wherein on a surface of the first mounting board and/or on a surface of the second mounting board at least partially a copper layer is disposed forming conductor tracks.

13. An EMC filter according to claim 4, wherein on a surface of the first mounting board and/or on a surface of the second mounting board at least partially a copper layer is disposed forming conductor tracks.

14. An EMC filter as in claim 2, wherein the first mounting board is disposed with its orientation perpendicular to the main board.

15. An EMC filter as in claim 3, wherein the first mounting board is disposed with its orientation perpendicular to the main board.

16. An EMC filter as in claim 4, wherein the first mounting board is disposed with its orientation perpendicular to the main board.

17. An EMC filter as in claim 5, wherein the first mounting board is disposed with its orientation perpendicular to the main board.

18. An EMC filter as in claim 6, wherein the first mounting board is disposed with its orientation perpendicular to the main board.

19. An EMC filter as in claim 7, wherein the first mounting board is disposed with its orientation perpendicular to the main board.

\* \* \* \* \*